(12) United States Patent
Moriya

(10) Patent No.: US 7,489,208 B2
(45) Date of Patent: Feb. 10, 2009

(54) SURFACE MOUNT CRYSTAL OSCILLATOR

(75) Inventor: Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 92 days.

(21) Appl. No.: 11/733,885

(22) Filed: Apr. 11, 2007

(65) Prior Publication Data

US 2007/0252655 A1 Nov. 1, 2007

(30) Foreign Application Priority Data

Apr. 12, 2006 (JP) ............................. 2006-110018

(51) Int. Cl.
*H01L 41/053* (2006.01)
*H03B 5/32* (2006.01)

(52) U.S. Cl. .................. 331/158; 310/348; 310/340

(58) Field of Classification Search .................. 331/68, 331/158; 310/315, 340, 341, 346
See application file for complete search history.

(56) References Cited

U.S. PATENT DOCUMENTS 6,445,254 B1 * 9/2002 Shibuya et al. ................ 331/68

7,135,810 B2 * 11/2006 Okajima ...................... 310/348
2003/0184398 A1 * 10/2003 Mizumura et al. .......... 331/158
2003/0197569 A1 10/2003 Mizusawa
2006/0055478 A1 3/2006 Isimaru

FOREIGN PATENT DOCUMENTS

JP 10-22735 1/1998

* cited by examiner

*Primary Examiner*—Vibol Tan
(74) *Attorney, Agent, or Firm*—Knobbe Martens Olson & Bear LLP

(57) ABSTRACT

A surface mount crystal oscillator comprises: a crystal blank; an IC chip in which at least an oscillator circuit using the crystal blank is integrated; a mounting substrate having one main surface on which the crystal blank is disposed, and the other main surface used to mounting the crystal oscillator on a wiring board; and a cover bonded to the mounting substrate for hermetically sealing the crystal blank within a space between the mounting substrate and the cover. The mounting substrate has the one main surface extending outward from a region in which the cover is disposed such that a portion of the one main surface exposes. Test terminals which are electrically connected to the crystal blank are disposed on the exposed region of the one main surface.

5 Claims, 5 Drawing Sheets

SURFACE MOUNT CRYSTAL OSCILLATOR

BACKGROUND OF THE INVENTION

1. Field of the Invention

The present invention relates to a surface mount quartz crystal oscillator having a quartz crystal blank and an IC chip (Integrated Circuit) that has integrated therein an oscillation circuit using the crystal blank, both of which are accommodated in a package of a surface mount type. More particularly, the present invention relates to a surface mount crystal oscillator which can ensure the connection of the IC chip to the package, and can be produced in a reduced size at a lower cost.

2. Description of the Related Art

Surface mount crystal oscillators are built particularly in compact mobile electronic devices represented by mobile telephones as reference sources for frequency and time because of their small size and light weight. Such a surface mount crystal oscillator contains an IC chip together with a crystal blank within a package, and is provided with a pair of test terminals disposed on an outer surface of the package for independently testing the crystal blank for oscillation characteristics as a crystal element.

FIG. 1A is a cross-sectional view illustrating a conventional surface mount crystal oscillator, and FIG. 1B is a plan view of the crystal oscillator. The illustrated surface mount crystal oscillator comprises IC chip 2 and crystal blank 3 contained in a recess defined in mounting substrate 1, which is a package body of a surface mount type, and metal cover 4 placed over the recess to hermetically seal IC chip 2 and crystal blank 3 therein, for example, as shown in US 2006/0055478 A1. Mounting substrate 1 is formed of laminated ceramics which include first substrate 1a in a flat and substantially rectangular shape, and a plurality of second substrates 1b each having a substantially rectangular opening. Second substrates 1b are laminated on one main surface of first substrate 1a. The openings formed through second substrates 1b define the recess in which IC chip 2 and crystal blank 3 are accommodated. A step is formed within the recess of mounting substrate 1 by making the openings different in size through a plurality of second substrates 1b. On the top surface of the step, a pair of crystal holding terminals (not shown) are formed for use in holding crystal blank 3.

Mounting terminals 5 are disposed at four corners on the other main surface of mounting substrate 1, i.e., on the outer bottom surface of the package body, for use in surface-mounting the crystal oscillator on a wiring board. Mounting terminals 5 include a power supply terminal, a ground terminal, an output terminal for an oscillation output, and the like.

IC chip 2 has electronic circuits integrated on a semiconductor substrate, where the electronic circuits include an oscillator circuit which uses crystal blank 3. When the crystal oscillator is of a temperature compensation type, IC chip 2 also integrally contains a temperature compensation mechanism for compensating crystal blank 3 for frequency-temperature characteristics. Such an oscillator circuit and temperature compensation mechanism are formed on one main surface of a semiconductor substrate by a general semiconductor device fabricating process. Accordingly, a circuit forming surface will herein refer to one of the two main surfaces of IC chip 2 on which the oscillator circuit is formed on the semiconductor substrate. The circuit forming surface is also formed with a plurality of IC terminals for connecting IC chip 2 to external circuits. The IC terminals include a power supply terminal, a ground terminal, an oscillation output terminal, a pair of connection terminals for connection to the crystal blank, and the like.

Circuit terminals 6 are disposed on the inner bottom surface of the recess in mounting substrate 1 in correspondence to the IC terminals, where circuit terminals 6 corresponding to the power supply terminal, ground terminal, and oscillation output terminal on IC chip 2 are electrically connected to mounting terminals 5. Circuit terminals corresponding to a pair of connection terminals of IC chip 2 are electrically connected to a pair of crystal holding terminals mentioned above IC chip 2 is secured to the bottom surface of the recess by electrically and mechanically connecting the IC terminals to circuit terminals 6 through ultrasonic thermo-compression bonding using bumps 7, such that the circuit forming surface faces the bottom surface of the recess in mounting substrate 1.

As illustrated in FIG. 2, crystal blank 3, which comprises, for example, a substantially rectangular AT-cut quartz crystal blank, is provided with excitation electrodes 8 on both main surfaces, respectively. From these excitation electrodes 8, lead-out electrodes 9 are extended toward both ends of one side of crystal blank 3, respectively. Crystal blank 3 is secured to crystal holding terminals formed on the step in the recess with conductive adhesive 10 at both ends of the one side thereof toward which lead-out electrodes 9 are extended, whereby crystal blank 3 is electrically and mechanically connected to the crystal holding terminals, and held within the recess. As a result, crystal blank 3 is electrically connected to the oscillator circuit within IC chip 2.

Metal cover 4 is bonded to a metal ring including a metal film disposed on an open end face around the recess of package body 1 by seal welding or beam welding.

A pair of test terminals 12 for crystal blank 3 are disposed on an outer side surface along one long side of mounting substrate 1. Test terminals 12 are electrically connected to crystal blank 3. Also, when the crystal oscillator is of a temperature compensation type, a pair of write terminals 13 are disposed on an outer side surface along the other long side of mounting substrate 1 for electric connection to IC chip 2. Write terminals 13 are used to write temperature compensation data into the temperature compensation mechanism within IC chip 2. The temperature compensation data is used to flatten the frequency-temperature characteristics exhibited by the crystal element, which may be represented, for example, by a cubic function curve. When the temperature compensation data is written, the power supply terminal and the like are used as well in addition to write terminals 13. A probe from an instrument or the like is brought into contact with these terminals 12, 13 when crystal blank 3 is tested for oscillation characteristics by test terminals 12 or when the temperature compensation data is written through write terminals 13 and the like. Write terminals 13 disposed on the outer side surface of the package is disclosed, for example, in JP-A-10-22735.

In such a crystal oscillator, after the open end face of mounting substrate 1 is covered with metal cover 4 to hermetically seal IC chip 2 and crystal blank 3 in the recess of mounting substrate 1, the oscillation characteristics, for example, crystal impedance of crystal blank 3 as a crystal element can be measured using test terminals 12 independently of an operating condition of IC chip 2. In this way, the oscillation characteristics of the crystal element can be confirmed after crystal blank 3 has been held and sealed. It should be noted that crystal blank 3 varies in oscillation characteristics as a crystal element when it is held or sealed in a package. Accordingly, the oscillation characteristics of crystal blank 3 must be confirmed after crystal blank 3 has been hermetically sealed.

Generally, the surface mount crystal oscillator configured as described above is mounted on a wiring board of a device in which the crystal oscillator is contained. The wiring board is also populated with a multiplicity of electronic parts, such as ICs, resistors, capacitors and the like, at a high density. Therefore, after the crystal oscillator has been mounted on the wiring board, difficulties are experienced in bringing a probe into contact with test terminals 12, disposed on an outer side surface of the package body of the crystal oscillator, causing a problem that the oscillation characteristics of the crystal element alone cannot be measured while the crystal oscillator remains mounted on the wiring board.

Since the crystal oscillator is mounted on a wiring board by so-called reflow soldering which involves carrying the crystal oscillator placed on the wiring board into a high-temperature furnace, the aforementioned conventional surface mount crystal oscillator implies the inability to measure the oscillation characteristics of the crystal element after the reflow soldering. Accordingly, no confirmation can be made on the influence on the crystal element when the crystal oscillator is secured to the wiring board by reflow soldering, for example, variations in frequency due to a difference in coefficient of thermal expansion between the wiring board and the mounting substrate of the crystal oscillator. This will give rise to a problem at a later time if strict conditions are imposed for the frequency accuracy required for the crystal oscillator.

Also, if a problem is found in the characteristics or functions of a device or wiring board itself which contains a surface mount crystal oscillator, it cannot be revealed from the crystal oscillator mounted on the wiring board whether or not the problem is caused by the crystal element of the surface mount crystal oscillator. In this event, the crystal oscillator is typically removed from the wiring board for measuring the oscillation characteristics of the crystal element, but it is desirable that the crystal element can be tested while the crystal oscillator remains mounted on the wiring board because the crystal element can vary in the oscillation characteristics before and after the removal.

SUMMARY OF THE INVENTION

It is an object of the present invention to provide a surface mount crystal oscillator which permits measurements to be made on the oscillation characteristics of a crystal blank as a crystal element even after the crystal oscillator has been mounted on a wiring board.

The object of the present invention is achieved by a surface mount crystal oscillator having a crystal blank, and an IC chip in which at least an oscillator circuit using the crystal blank is integrated. The crystal oscillator includes a mounting substrate having one main surface on which the crystal blank is disposed, and the other main surface used to mount the crystal oscillator on a wiring board; and a cover bonded to the mounting substrate for hermetically sealing the crystal blank within a space between the mounting substrate and the cover, wherein the mounting substrate has the one main surface extending outward from a region in which the cover is disposed such that a portion of the one main surface exposes, and the crystal oscillator comprises test terminals disposed on an exposed region of the one main surface and electrically connected to the crystal blank.

In the configuration described above, since the test terminals are disposed on one main surface of a portion of the mounting substrate which protrudes from the position at which the cover is formed, the test terminals expose upward on the one main surface even after the surface mount crystal oscillator has been mounted on a wiring board. Accordingly, the crystal oscillator can be tested for oscillation characteristics of the crystal element (i.e., crystal blank) even after it has been mounted on a wiring board.

In the present invention, the mounting substrate preferably comprises a laminated ceramic in which a plurality of ceramic layers are laminated, at least one of the plurality of ceramic layers protrudes from the other ceramic layers in an in-plane direction of the laminate, and the test terminals are disposed at positions on the protruding ceramic layer. In this event, a metal film is preferably formed around periphery of the uppermost layer of the plurality of ceramic layers closest to the one main surface, wherein the cover is a metal cover formed in concave shape, and the metal cover comprises an open end face which is bonded to the metal film with an eutectic alloy. In such a configuration, the width of the portion at which the metal cover is bonded to the mounting substrate can be reduced, so that the crystal oscillator can be prevented from increasing in outside dimensions even if the test terminals are disposed to expose upward.

DETAILED DESCRIPTION OF THE PREFERRED EMBODIMENTS

Figure 1A:
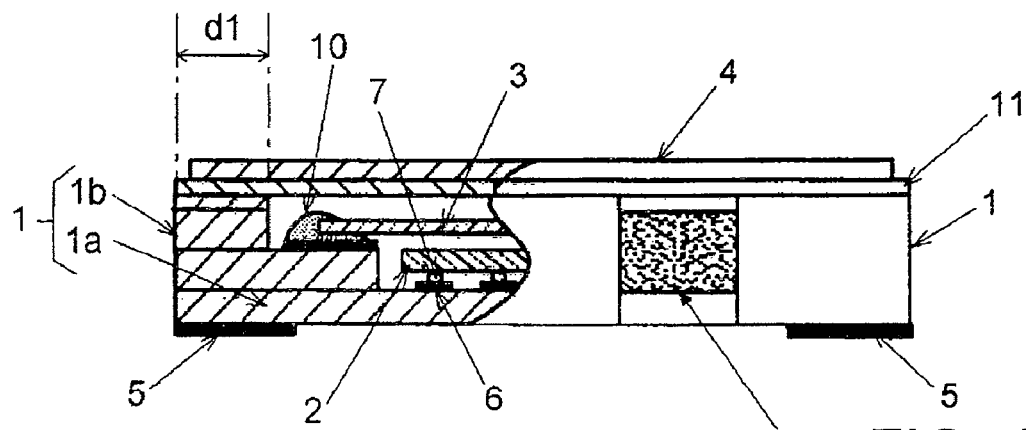
FIGS. 1A and 1B are a partially cut-away front view and a plan view, respectively, illustrating a conventional surface mount crystal oscillator.
Figure 1B:
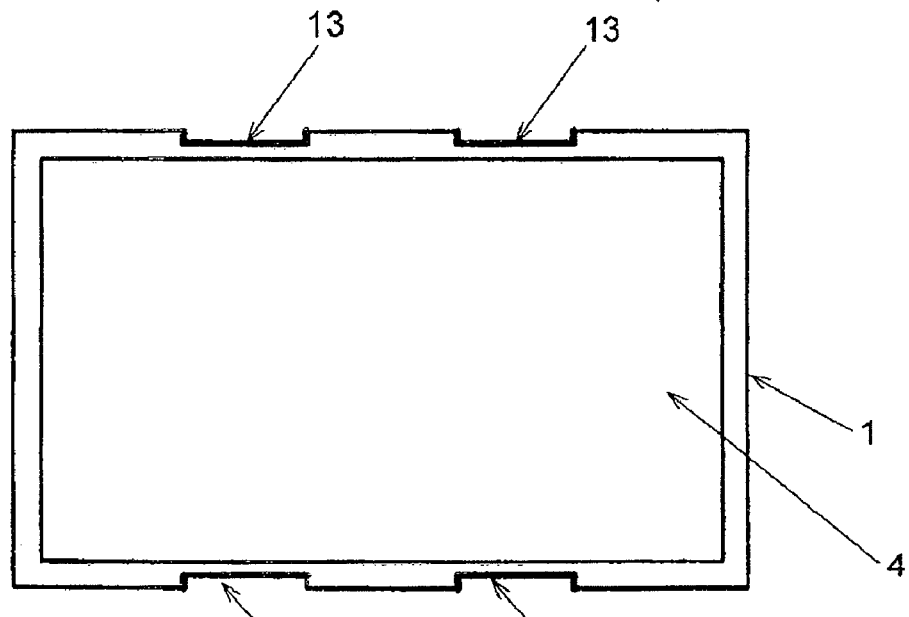
Figure 2:
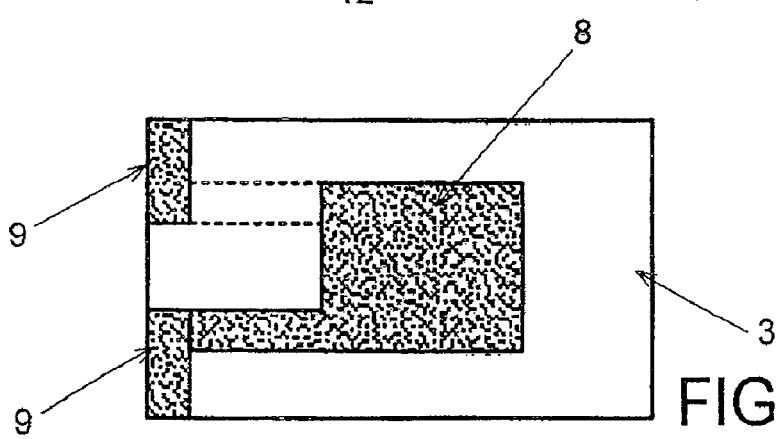
FIG. 2 is a plan view of a crystal blank.
Figure 3A:
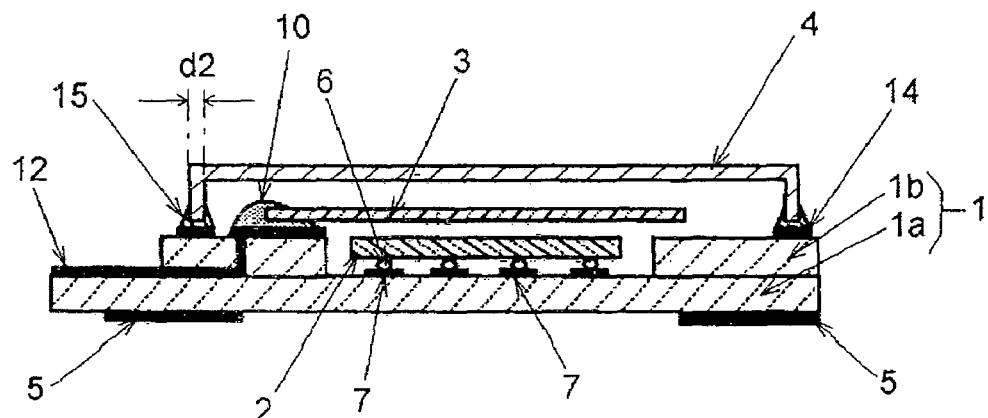
FIGS. 3A and 3B are a cross-sectional view and a plan view, respectively, illustrating a surface mount crystal oscillator according to a first embodiment of the present invention.
Figure 3B:
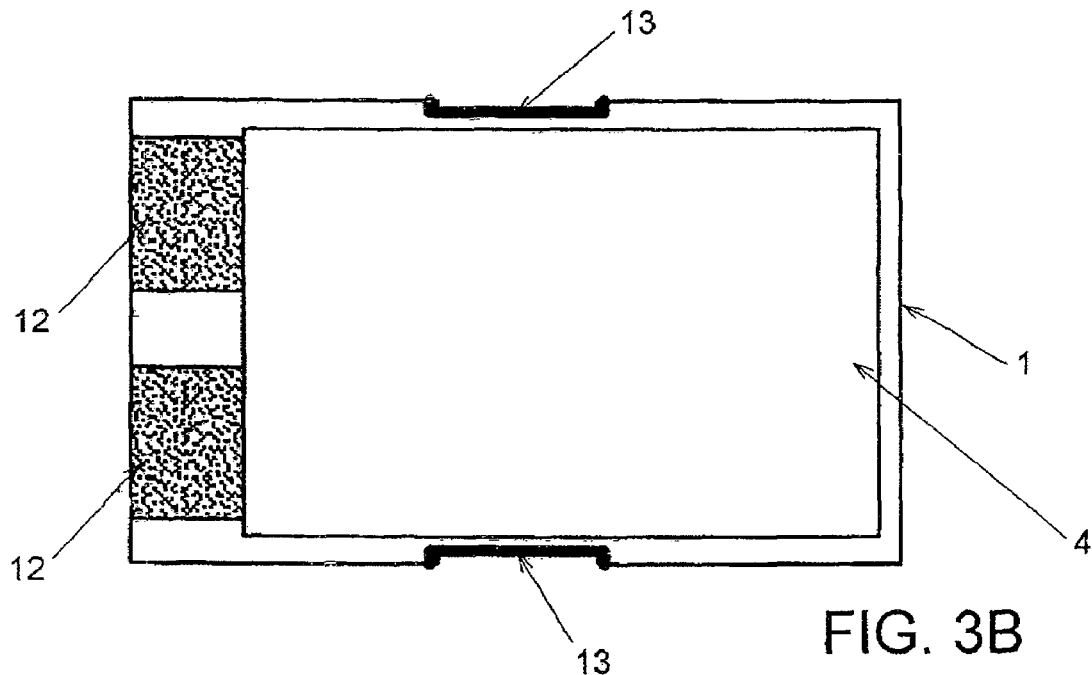

In FIGS. 3A and 3B which illustrate a surface mount crystal oscillator according to a first embodiment of the present invention, the same components as those in FIGS. 1A and 1B are designated the same reference numerals, and repeated descriptions will be omitted.

The crystal oscillator according to the first embodiment illustrated in FIG. 3A comprises: mounting substrate 1 formed of a laminated ceramic in which first substrate 1a in a flat and substantially rectangular shape, and second substrate 1b having a substantially rectangular opening are laminated; IC chip 2 and crystal blank 3 secured to mounting substrate 1; and metal cover 4 placed over mounting substrate 1 to hermetically seal IC chip 2 and crystal blank 3 within a space defined by mounting substrate 1 and metal cover 4. Metal cover 4 used herein is formed in concave shape. IC chip 2 and crystal blank 3 used herein are similar to those described above. A recess is formed in mounting substrate 1 by the opening formed through second substrate 2b, and IC chip 2 is secured to the inner bottom surface of the recess through ultrasonic thermo-compression bonding using bumps 7 in a manner similar to the foregoing. On the top surface of second substrate 1b, a pair of crystal holding terminals are formed in a peripheral region along one side of the opening. Both ends of one side of crystal blank 3, toward which lead-out electrodes 9 of crystal blank 3 are extended, are secured to the crystal holding terminals with conductive adhesive 10, thereby holding crystal blank 3 at a position above the recess.

Mounting terminals 5 for use in mounting the crystal oscillator on a wiring board are disposed at four corners on the main surface of mounting substrate 1 which is not formed with the recess, i.e., the outer bottom surface of the crystal oscillator. Mounting terminals 5 are electrically connected to IC chip 2 through conductive paths, not shown, formed on mounting substrate 1 and circuit terminals 6.

Metal film 14 is disposed along the periphery of the top surface of second substrate 1b. An open end face of metal cover 4 formed in concave shape is bonded to metal film 14 through thermo-compression bonding using eutectic alloy 15, as shown in US 2003/0197569 A1 or the like. The recess of metal cover 4 and mounting substrate 1 define a space in which IC chip 2 and crystal blank 3 are accommodated.

In this crystal oscillator, first substrate 1a has a longitudinal length longer than the longitudinal length of second substrate 1b, so that first substrate 1a protrudes from second substrate 1b on one side of the crystal oscillator, as viewed from above, causing the top surface of first substrate 1a to expose in this area, as illustrated in FIG. 3B. A pair of test terminals 12 are disposed on the exposed top surface of first substrate 1a. Test terminals 12 are electrically connected to the crystal holding terminals through conductive paths formed on a lamination plane on which second substrate 1b is laminated on first substrate 1a, and via-holes formed through second substrate 1b. The crystal holding terminals are also electrically connected to IC chip 2 through conductive paths, not shown, and circuit terminals 6.

A pair of write terminals 13 are disposed on outer side surfaces of mounting substrate 1 for use in writing temperature compensation data, in a manner similar to the foregoing.

In this crystal oscillator, since test terminals 12 are disposed on the exposed top surface of first substrate 1a which protrudes from second substrate 1b, a probe can be brought into contact with test terminals 12 from above, the crystal oscillator even after the surface mount crystal oscillator has been mounted on a wiring board by reflow soldering or the like, thus making it possible to freely measure the oscillation characteristics of the crystal element and improve the reliability. Also, even if the wiring board itself presents defective characteristics, the true cause of the defect can be readily tracked for confirmation because the oscillation characteristics of the crystal element can be confirmed.

In the crystal oscillator described above, the open end face of metal cover 4 formed in concave shape is bonded to mounting substrate I through thermo-compression bonding with eutectic alloy 15, so that the width of bonding plane of the metal cover 4 to metal film 14 can be reduced by reducing thickness d2 of metal cover 4. In this way, since mounting substrate 1 and metal cover 4 can define a larger effective area of the sealed package, the crystal oscillator can be prevented from an increase in size as a whole even if first substrate 1a protrudes from second substrate 1b.

For reference, in the conventional example which involves seam welding of a flat metal cover, the topmost ceramic layer of the laminate in mounting substrate 1 must have frame width d1 (see FIG. 1A) equal to or larger than the thickness of the ceramic layer from a viewpoint of manufacturing and the like, where d1 is, for example, approximately 0.35 mm. In contrast, since no particular limitations are imposed to thickness d2 of metal cover 4 in this embodiment, thickness d2 can be approximately 0.08 mm, by way of example. Even if a flange is formed on the open end face of metal cover 4 for ensuring that metal cover 4 is bonded to metal film 14 on the open end face thereof, metal cover 4 will have a thickness of approximately 0.1 mm at most in the flange. Accordingly, a width required for the bonding of metal cover 4 can be significantly reduced from the conventional one by bonding the open end face of metal cover 4 formed in concave shape to mounting substrate 1.

Figure 4A:
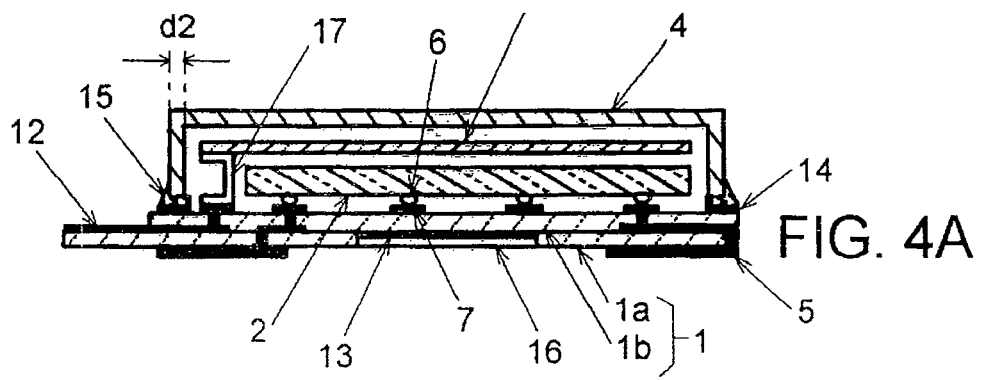
FIGS. 4A to 4C are a cross-sectional view, a plan view, and a bottom view, respectively, illustrating a surface mount crystal oscillator according to a second embodiment of the present invention.
Figure 4B:
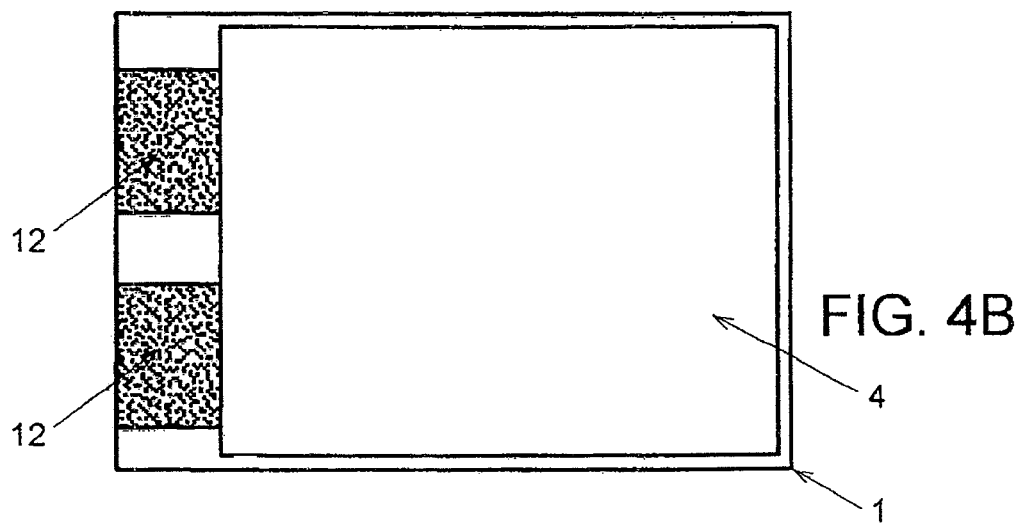

Next, a surface mount crystal oscillator according to a second embodiment of the present invention will be described with reference to FIGS. 4A to 4C.

The crystal oscillator according to the second embodiment largely differs from the first embodiment in that mounting substrate 1 is not formed with a recess used to contain IC chip 2 therein. Thus, second substrate 1b is formed flat without a central opening, and a circuit forming surface of IC chip 2 is secured to the flat surface of second substrate 2 through ultrasonic thermo-compression bonding using bumps 7. Similar to the first embodiment, one side of first substrate 1a protrudes from second substrate 1b, and a pair of test terminals 12 are disposed on the exposed top surface of protruding first substrate 1a.

A pair of metal supporters 17 are used to dispose crystal blank 3 above IC chip 2, Supporters 17, which have a height larger than the thickness of IC chip 2, are each made up of a vertically extending body portion and L-shaped portions formed at both ends of the body portion, respectively. The leading end of the L-shaped portion at one end (i.e., proximal end) of supporter 17 extends in the same direction as the leading end of the L-shaped portion at the other end (i.e., distal end) of the same. A side surface of the L-shaped portion at the proximal end is bonded to relay terminal 12 formed on the top surface of second substrate 1b. Crystal blank 3 is horizontally held above IC chip 2 by bonding a pair of lead-out electrodes 9, extended to both ends of one side of crystal blank 3, to the L-shaped portions on the distal ends of a pair of supporters 17. Relay terminals 12 are electrically connected to test terminals 12 through via-holes formed through second substrate 1b and conducive paths formed on a lamination plane between first substrate 1a and second substrate 1b, and is electrically connected to IC chip 2 as well. Consequently, crystal blank 3 is electrically connected to test terminals 12, and electrically connected to IC chip 2 as well.

Figure 4C:
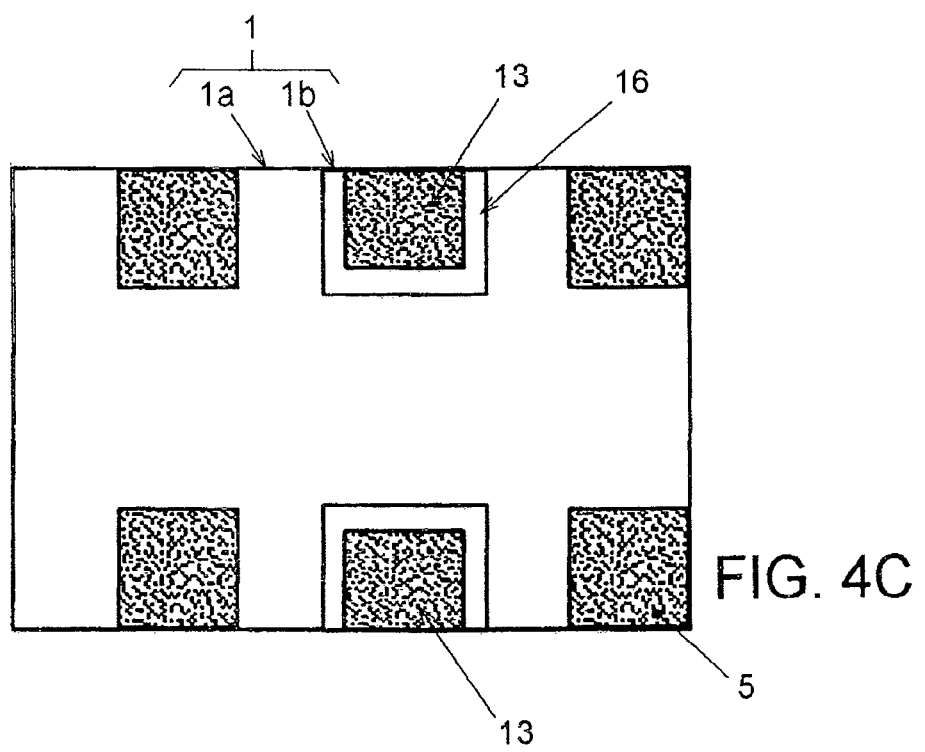

First substrate 1a is provided with cutouts 16 in respective central regions of a pair of long sides thereof, so that second substrate 1b exposes at the positions of cutouts 16, as illustrated in FIG. 4C when the crystal oscillator is viewed from its bottom side. Then, write terminals 13 are disposed on the surface of second substrate 1b, which is exposed through cutouts 16, for writing the temperature compensation data.

In the surface mount crystal oscillator of this embodiment, since test terminals 12 are disposed likewise on the surface of first substrate 1a which extends from second substrate 1b on one side, the oscillation characteristics of the crystal element can be independently measured even after the crystal oscillator has been mounted on a wiring board in a manner similar to the first embodiment. In addition, since the open end face of metal cover 4 formed in concave shape is bonded to mounting substrate 1 with eutectic alloy 15, metal cover 4 can be bonded with a smaller width to avoid an increase in size of the crystal oscillator as a whole.

Second substrate 1b is flat and does not have an opening in a central region in which IC chip 2 is secured. In this configuration, when mounting substrate 1 is formed, for example, by laminating and burning ceramic green sheets (i.e., unburned ceramic sheets), mounting substrate 1 can be prevented from curving into a concave shape due to a contraction force which would be caused by openings if the openings were formed through central regions of the ceramic green sheets. It is therefore possible to readily secure IC chip 2 to mounting substrate 1 through ultrasonic thermo-compression bonding using bumps 7. Also, first substrate 1a is formed with cutouts 16 on both long sides to expose second substrate 1b, and write terminals 13 are disposed on the exposed surface of second substrate 1b, so that write terminals 13 can be increased in area, as compared with write terminals 13 disposed on outer side surfaces of mounting substrate 1. Particularly, a mounting substrate tends to have a small thickness when it does not have a recess for accommodating an IC chip, and accordingly, write terminals tend to have a smaller area when they are disposed on outer side surfaces. In contrast, since the crystal oscillator of this embodiment has write terminals 13 disposed on the bottom surface of the crystal oscillator, the write terminals 13 can be provided with a sufficiently large area. Also, since each cutout 16 are open on one side thereof, a probe can be more readily brought into contact with write terminals 13 as compared with those write terminals which are disposed within a recess entirely surrounded by a side wall. Cutouts 16 formed in first substrate 1a are positioned in a peripheral region of first substrate 1a and each have an area smaller than that of the recess for accommodating IC chip 2, so that the influence exerted by such cutouts 16 would be mitigated when laminated ceramic layers are baked.

Figure 5A:
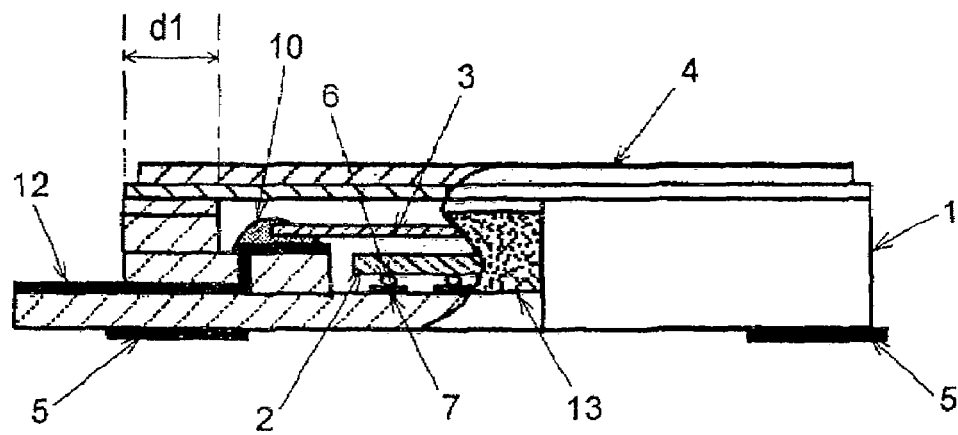
FIGS. 5A and 5B are a partially cut-away front view and a plan view, respectively, illustrating a surface mount crystal oscillator according to another embodiment of the present invention.
Figure 5B:
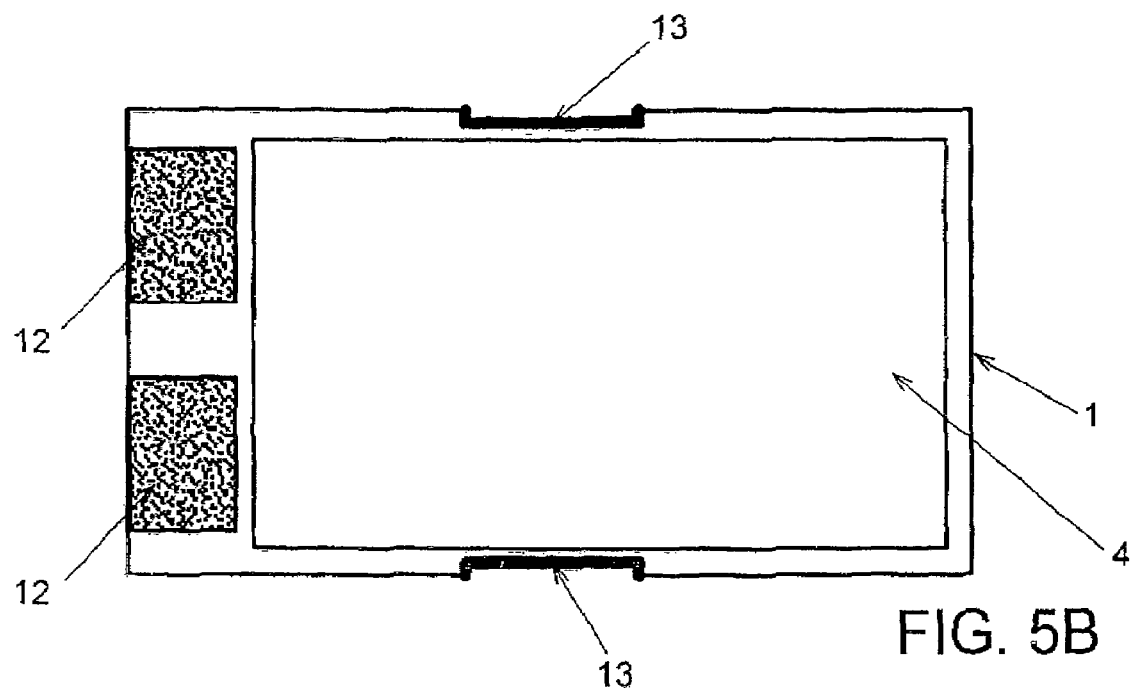

Next, a surface mount crystal oscillator according to a third embodiment of the present invention will be described with reference to FIGS. 5A and 5B.

In the first and second embodiments, the metal cover formed to have a recess is bonded to the mounting substrate with an eutectic alloy, whereas flat metal cover 4 is bonded to mounting substrate 1 by seam welding or the like in the crystal oscillator of the third embodiment in a manner similar to that shown in FIGS. 1A and 1B. Likewise, in this event, first substrate 1a is protruded from second substrate 1a, and test terminals 12 are disposed on the top surface of protruding first substrate 1a, thereby making it possible to measure the oscillation characteristics of the crystal element even after the crystal oscillator has been mounted to a wiring board. In the illustrated crystal oscillator, write terminals 13 are disposed on outer side surfaces of mounting substrate 1.

Figure 6:
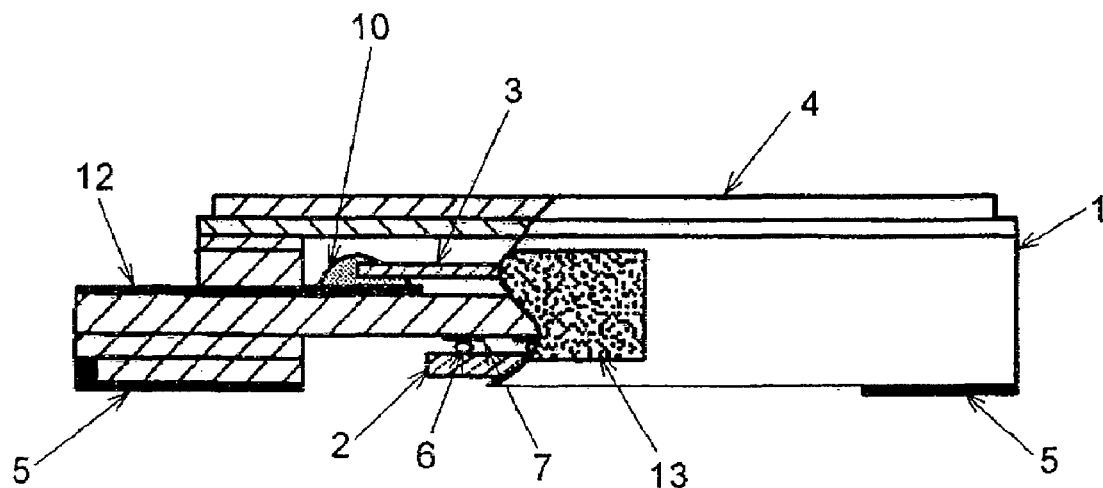
FIG. 6 is a cross-sectional view illustrating a surface mount crystal oscillator according to a yet another embodiment based on the present invention.

In the crystal oscillators of the first to third embodiments described above, IC chip 2 and crystal blank 3 are disposed on one main surface side of mounting substrate 1, but the present invention is not limited to such positioning. For example, as illustrated in FIG. 6, crystal blank 3 may be disposed on one main surface of mounting substrate 1 and hermetically sealed by metal cover 4, while mounting substrate 1 may be formed with a recess on the other main surface, in which IC chip 2 may be placed. In this event, mounting substrate 1 is protruded beyond the position at which metal cover 4 is disposed, such that test terminals 12 are formed at positions on the top surface of mounting substrate 1 which is not covered with metal cover 4. In the crystal oscillator illustrated in FIG. 6, mounting substrate 1 is additionally formed with a recess on the one main surface for accommodating crystal blank 3 therein. Alternatively, however, no recess may be formed for accommodating crystal blank 3, but a metal cover formed in concave shape may be bonded to the one main surface of mounting substrate 1 with an eutectic alloy.

Figure 7:
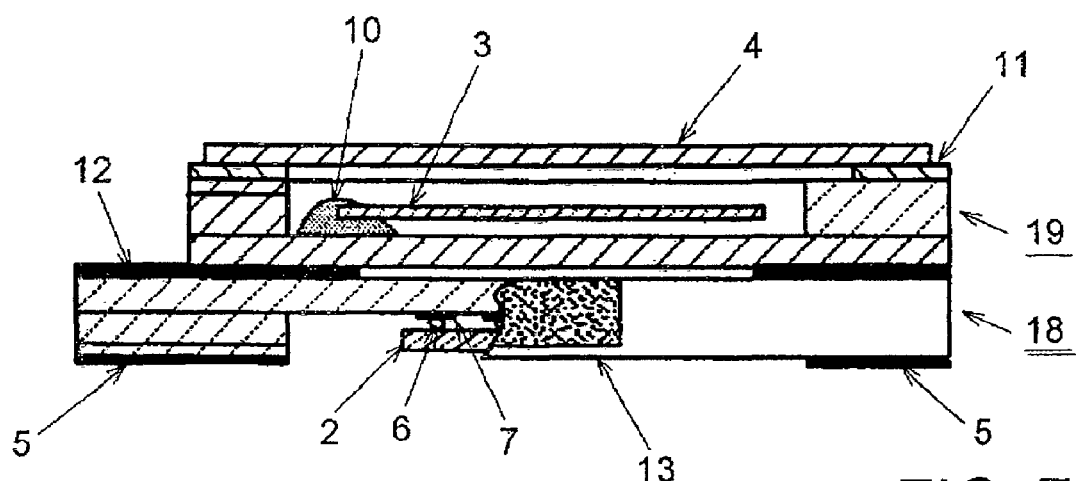
FIG. 7 is a cross-sectional view illustrating a surface mount crystal oscillator according to a yet further embodiment based on the present invention.

Further, as illustrated in FIG. 7, the present invention can be applied to a so-called bonding type crystal oscillator as well. Specifically, the illustrated crystal oscillator comprises surface mount crystal unit 18 which has crystal blank 3 accommodated in a package body and hermetically sealed by metal cover 4, and package assembly 19 which has IC chip 2 contained therein and mounting terminals 5 and bonded to the bottom surface of crystal unit 18.

In essence according to the present invention, in a mounting substrate having at least crystal blank 3 hermetically sealed in one main surface thereof by metal cover 4, and mounting terminals disposed on the other main surface, at least one of laminated layers which make up the mounting substrate protrudes from the position at which metal cover 4 is disposed and exposes on one main surface side, and test terminal 12 are disposed at positions on the exposed surface. Consequently, the oscillation characteristics of the crystal element can be measured even after the crystal oscillator has been mounted on a circuit board.

What is claimed is:

1. A surface mount crystal oscillator having a crystal blank, and an IC chip in which at least an oscillator circuit using the crystal blank is integrated, said crystal oscillator comprising:
   a mounting substrate having one main surface on which said crystal blank is disposed, and the other main surface used to mount said crystal oscillator on a wiring board; and
   a cover bonded to said mounting substrate for hermetically sealing said crystal blank within a space between said mounting substrate and said cover,
   wherein said mounting substrate has the one main surface extending outward from a region in which said cover is disposed such that a portion of the one main surface exposes, and said crystal oscillator comprises test terminals disposed on an exposed region of the one main surface and electrically connected to said crystal blank.

2. The crystal oscillator according to claim 1, wherein said IC chip is disposed in the space.

3. The crystal oscillator according to claim 1, wherein said mounting substrate is formed with a recess in the other main surface, and said IC chip is disposed in the recess.

4. The crystal oscillator according to claim 1, wherein said mounting substrate comprises a laminated ceramic in which a plurality of ceramic layers are laminated, at least one of said plurality of ceramic layers protrudes from the other ceramic layers in an in-plane direction of the laminate, and said test terminals are disposed at positions on the protruding ceramic layer.

5. The crystal oscillator according to claim 4, further comprising a metal film formed around periphery of an uppermost layer of said plurality of ceramic layers closest to the one main surface, wherein said cover is a metal cover formed in concave shape, and said metal cover comprises an open end face which is bonded to said metal film with an eutectic alloy.

* * * * *